United States Patent [19]

Frisbie et al.

[11] Patent Number: 5,151,650
[45] Date of Patent: Sep. 29, 1992

[54] PACKAGED SEMICONDUCTOR DEVICE HANDLER

[75] Inventors: Milo W. Frisbie; Larry A. Nickerson; Mavin C. Swapp, all of Mesa, Ariz.

[73] Assignee: Motorola, Inc., Schaumburg, Ill.

[21] Appl. No.: 753,455

[22] Filed: Sep. 3, 1991

[51] Int. Cl.[5] ............... G01R 31/28; B07C 5/344
[52] U.S. Cl. .............. 324/158 F; 324/158 P; 209/573
[58] Field of Search ............ 324/72.5, 158 R, 158 P, 324/158 F; 209/573, 574, 571, 540; 414/222, 225; 198/394

[56] References Cited

U.S. PATENT DOCUMENTS

| | | | |
|---|---|---|---|
| 3,629,702 | 12/1971 | Henken | 209/573 |
| 4,506,213 | 3/1985 | O'Connor | 324/158 F |
| 4,588,092 | 5/1986 | Moechrig et al. | 324/158 F |
| 4,926,118 | 5/1990 | O'Connor et al. | 324/158 F |
| 5,023,544 | 6/1991 | Vallone et al. | 209/573 |

Primary Examiner—Vinh Nguyen
Attorney, Agent, or Firm—Stuart T. Langley

[57] ABSTRACT

A handler (11) which transports a number of packaged semiconductor devices (12) in a boat (23) to a test head (14) and tests the devices (12) is provided. The handler (11) has an input staging section (29), a testing section (31) which is adjacent to the test head (14), and an output staging section (36). A boat transport (27a, 27b) moves the boat (23) from the input staging section (29) to the testing section (31) and from the testing section (31) to the output staging section (36). The boat transport (27a, 27b) operates during the device testing to provide substantially parallel operation of the testing and handling steps. A boat lift (39) moves the boat (23) to the test head (14) to allow the packaged semiconductor devices (12) to remain in the boat (23) during testing.

17 Claims, 3 Drawing Sheets

PACKAGED SEMICONDUCTOR DEVICE HANDLER

BACKGROUND OF THE INVENTION

The present invention relates, in general, to semiconductor device handlers, and more particularly, to a handler for testing packaged semiconductor devices.

In the past, the semiconductor industry had used testers which evaluated packaged semiconductor devices individually in a serial fashion. These testers had individual handlers which supplied devices to the tester one at a time. These previous handlers had comparatively low throughput.

As electronic technology improved, tester electronics became faster than the handlers which supplied them. This results in inefficient use of the tester as the electronics remain idle while the handler transports devices. A partial solution is achieved by parallel testing where a number of devices are tested at one time. Further improvement in handling efficiency is achieved by batch handling where several packaged devices are transported to and from the tester electronics grouped together in boats or device carrier trays.

One disadvantage of existing batch handlers is that the boats are moved via a system of cables and pulleys. The boats are not rigidly attached to the cable, so movement is relatively slow. Also, precise positioning of the boat is difficult and frequent maintenance and adjustment is required. As the cables age they stretch, requiring frequent realignment and maintenance.

Another disadvantage of existing batch handlers is that pick and place equipment is required to transfer packaged devices from the transport boat to the tester electronics. Pick and place equipment is also needed to remove tested devices from the tester and return them to the boat. This transfer operation not only increases equipment complexity, but also consumes a large amount of time while the tester electronics remains idle.

An additional disadvantage of available batch handlers is that the handling mechanism remains idle during the testing operation. Packaged devices are emptied from the transport boat during test, so the boat remains idle waiting for the return of the devices before it continues. The nature of the handling and testing operations remains essentially a serial process in currently available handlers.

Accordingly, it is desirable to have a batch handler for packaged semiconductor devices where the devices can be inserted as group into the tester. It is also desirable to have a handler which operates in parallel with the tester so that handling operations are performed during the testing operation, and the tester is operating during a large portion of the handling time.

SUMMARY OF THE INVENTION

Briefly stated, the present invention is achieved by a handler which transports a number of packaged semiconductor devices in a boat to a test head. The handler has an input staging section, a testing section which is adjacent to the test head, and an output staging section. A means for transporting the boat from the input staging section to the testing section and from the testing section to the output staging section operates during the device testing to provide substantially parallel operation of the testing and handling steps. A means for lifting the boat to the test head is provided to allow the packaged semiconductor devices to remain in the boat during testing.

DETAILED DESCRIPTION OF THE DRAWINGS

Rapid semiconductor device testing provides a major cost savings to manufacturers and end users. Handling of packaged semiconductor devices consumes a large, if not the largest, component of time required to test. Electronic testers often operate only a fraction of the test time because the handling mechanism is unable to deliver and transport the semiconductor devices to the tester as fast as the tester is able to evaluate them. In accordance with the present invention, handling time is reduced by testing a number of semiconductor devices simultaneously, and handling the number of packaged semiconductor devices in a batch, or group. The number of packaged semiconductor devices are inserted into the tester at the same time, eliminating time required to handle individual devices. Test time is further reduced by providing a handling method and mechanism which can rapidly accelerate and decelerate devices towards the tester. Efficient use of the tester is achieved by performing handling operations in parallel with the testing operations.

Figure 1:
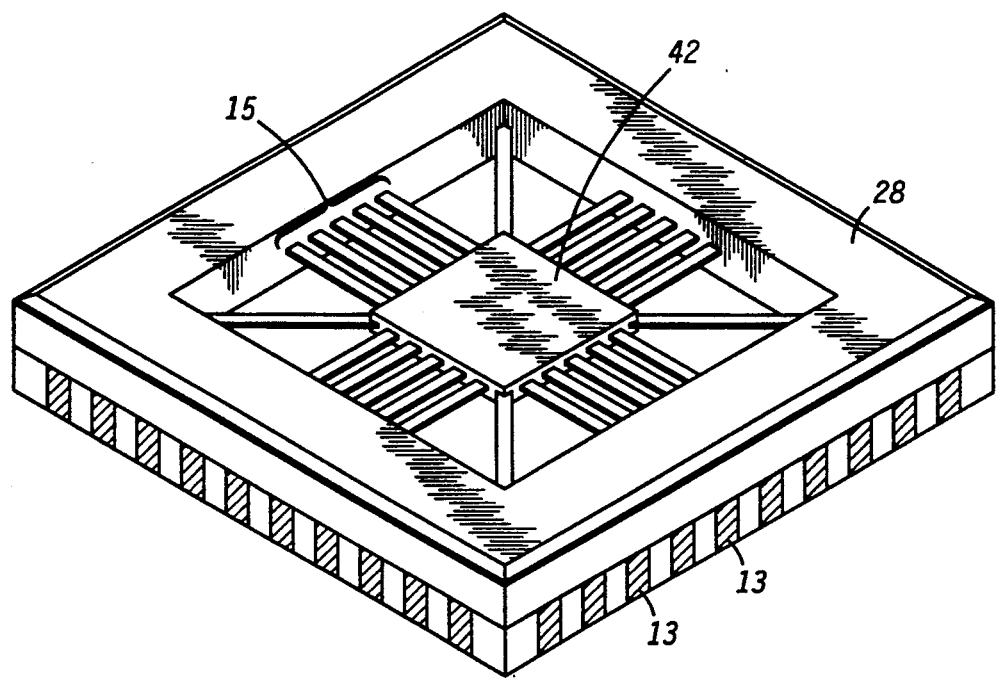
FIG. 1 illustrates a packaged semiconductor device which can be tested in accordance with the present invention.

The present invention is readily adaptable to a number of semiconductor devices, packages, and package styles. It is particularly useful for handling molded carrier ring (MCR) packages. FIG. 1 illustrates a simplified MCR packaged semiconductor device 12 widely used in the semiconductor industry. Device 12 comprises an encapsulated integrated circuit 42 having a plurality of internal leads 15 extending therefrom for coupling to external circuitry. Internal leads 15 extend outward to carrier ring 28. A plurality of external leads or test leads 13 are formed around a peripheral portion of carrier ring 28. Internal leads 15 coupled to external leads 13 so that encapsulated integrated circuit 12 may be electrically accessed via external leads 13. Carrier ring 28 serves to protect internal leads 15 during testing and shipping operations, and is usually discarded by a final user.

Figure 2:
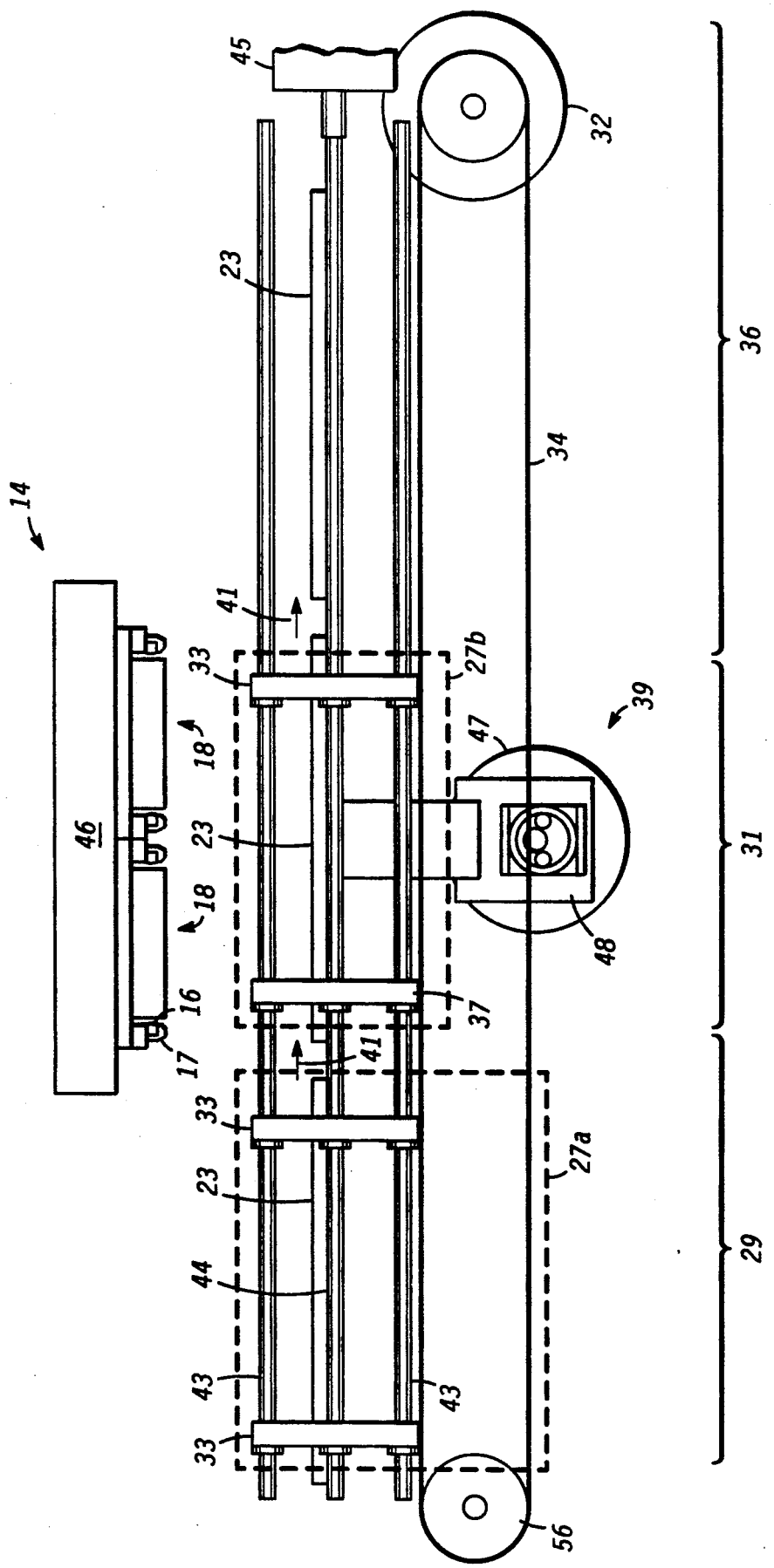
FIG. 2 illustrates a simplified side view of a handler and test head in accordance with the present invention.

FIG. 2 illustrates a simplified perspective view of a semiconductor device handler 11 in accordance with the present invention. Handler 11 is illustrated with test head 14 and tester 46, which are capable of testing a number of packaged semiconductor devices 12 at one time. It should be understood, however, that practice of the present invention does not require multiple device testing, especially for high pin count devices where multiple device testers are unavailable. Test head 14 is described in greater detail in reference to FIG. 3.

Packaged semiconductor devices 12 are transported in accordance with the present invention in boats 23. Boats 23 are configured to hold as many packaged semiconductor devices 12 as test head 14 is able to simultaneously test. For example, a 1024 pin test head 14 can simultaneously test four packaged semiconductor devices 12 each having 256 leads 13. In this case, boat 23 will hold four packaged semiconductor device 12.

Handler 11 moves boats 23 through a travel path indicated by arrows 41. Travel path 41 comprises an input staging section 29, a testing section 31, and an output staging section 36. Packaged semiconductor devices 12 are loaded into boats 23, and boats 23 are positioned in input staging section 29. Boats 23 are transported first from input staging section 29 to testing section 31. Second, boats are transported from testing section 31 to output staging section 36. Because of this two stage transportation, it is useful to describe handler 11 as comprising a first boat transporter shown generally by dashed box 27a, and a second boat transporter shown generally by dashed box 27b.

In a preferred embodiment, boat transporter 27a comprises a pair of boat grasps 33 for holding boat 23. In a preferred embodiment, grasps 33 are mounted to slide along shafts 43. Grasps 33 are also coupled to a keyed shaft 44 which is used to activate the grasping mechanism. Grasps 33 and keyed shaft 44 are described in greater detail in reference to FIG. 5. Grasps 33 are powered by motor 32. Grasps 33 are coupled to motor 32 by a closed loop belt 34. Belt 34 wraps around a spindle on motor 32 at one end of handler 11, and around a pulley 56 at another end of handler 11. Belt 34 moves in a first direction when motor 32 rotates clockwise, and in a second direction when motor 32 rotates counterclockwise. When belt 34 moves in the first direction, grasps 33 travel along slides 43 in the first direction, moving boat 23 from input staging section 29 to testing section 31. Boat 23 is released from grasps 33 in testing section 31, and belt 34 is moved in the second direction to return grasps 33 to input staging section 29.

In the preferred embodiment, a second set of boat grasps 37 are coupled to motor 32 by belt 34. Other mechanisms for powering or driving grasps 33 and 37 are well known, such as gears, pneumatic pistons, or the like. Alternatively, boat grasps 37 could be powered by an independent motor and belt, or some other independent drive means, but it is important that movement of grasps 37 is coordinated with movement of grasps 33. Grasps 37 move out of testing section 31 before grasps 33 enter testing section 31. This coordination is easily achieved by the combination of motor 32 and belt 34, but care should be taken when using other means of powering grasps 33 in travel path 41.

Testing section 31 is adjacent to test head 14, and in the preferred embodiment is located underneath test head 14. Once grasps 33 carry a boat 23 to testing section 31, motor 32 momentarily pauses. During this pause, boat 23 is lifted from travel path 41 by a boat lift, indicated generally at 39. Although many mechanisms are available for lifting boat 23, in a preferred embodiment boat lift 39 comprises motor 47 turning eccentric wheel 48. Eccentric wheel 48 pushes boat 23 in testing section 31 towards test head 14. This lifting motion inserts packages semiconductor devices 12 (not shown) in boat 23 into test head 14. Preferably, the lifting motion uncouples boat 23 from grasp 33 so that grasp 33 can begin to move back towards input staging section 29 even before grasp 33 is deactivated.

Boat lift 39 inserts and holds boat 23 and packaged semiconductor devices 12 in test head 14 until testing is complete. Because packaged semiconductor devices 12 remain in boat 23 during insertion, the step of inserting is extremely fast. Because multiple devices are tested in parallel, the step of testing is extremely fast.

During the step of testing, grasps 33 are returned to input staging section 29 and another boat is positioned in input stage 29. Also, grasps 37 are moved from output staging section 36 to testing section 31, and are prepared to receive boat 23 once testing is complete. One important feature of the present invention is that boat transporters 27a and 27b are active during the step of electrical testing. Because boat transporters 27a and 27b can move and prepare to test subsequent devices during the testing step, overall cycle time is greatly reduced.

Once testing is complete, boat lift 39 is activated to lower boat 23 back into testing section 31 of travel path 41. In the preferred embodiment, grasps 37 are activated by rotating keyed shaft 44. Motor 32 is activated to move belt 34 in the first direction, and grasps 37 and boat 23 are moved into output staging section 36. When grasps 33 and 37 are coupled to a single motor 32 by a single belt 34, as shown in FIG. 2, a second boat 32 is moved from input staging section 29 to testing section 31 at the same time that the first boat 23 is moved from testing section 31 to output staging section 36.

Figure 3:
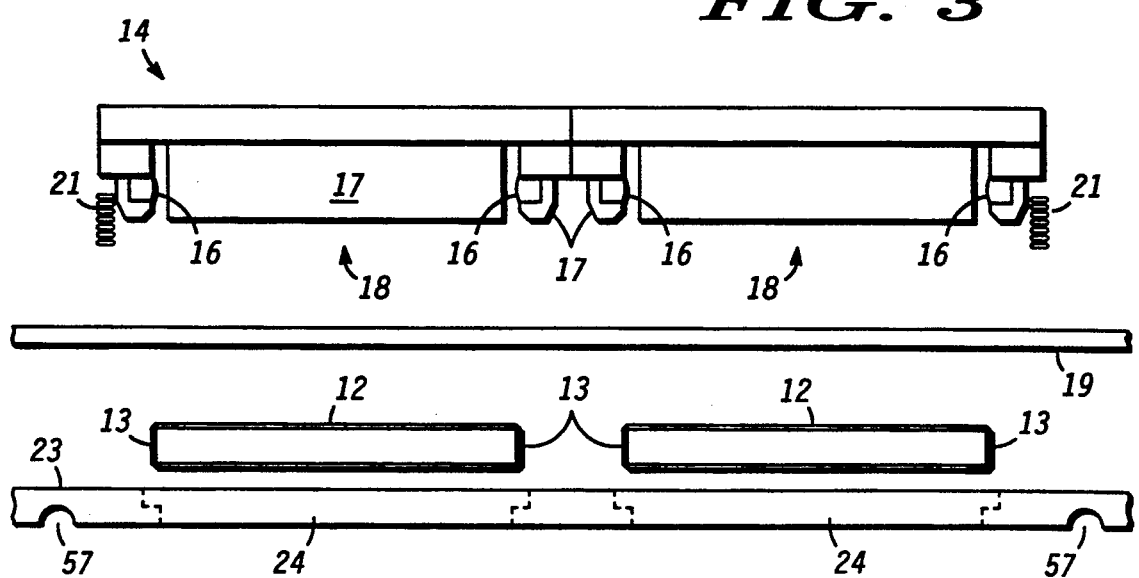
FIG. 3 illustrates an exploded view of a test head used in the handler of FIG. 2.

FIG. 3 illustrates a partially exploded side view of test head 14. Test head 14 comprise a plurality of contacts 16 and serves to coupled external leads 13, shown in FIG. 1, to device tester 46 shown in FIG. 2. Contacts 16 are held in place by contact guides 17 in a preferred embodiment. The test head configuration illustrated in FIG. 3 is desirable in the practice of the present invention, but other test head configurations are known. Test head 14 has a surface 18, or test pocket, for receiving packaged semiconductor devices 12. Once packaged semiconductor devices 12 are inserted into test pocket 18, leads 13 are firmly coupled to contacts 16.

A number of compartments 24 are provided in boat 23, illustrated in phantom in FIG. 3. A number of packaged semiconductor devices 12 are placed in compartments 24 during handling and test. Prior handlers require packaged semiconductor devices 12 to be individually removed from boat 23 and inserted into test pockets 18, a time consuming process. In contrast, in accordance with the present invention, boat 23 is lifted by boat lift 39, shown in FIG. 2, and the number of devices held in boat 23 are simultaneously inserted into the number of test pockets 18. The procedure in accordance with the present invention reduces equipment complexity, increases reliability, and reduces handling time by a factor of four.

Device ejector 19 is provided as a part of test head 14 to remove packaged semiconductor devices from test pockets 18 once testing is complete. Device ejector 19 preferably comprises a thin sheet of patterned rigid material, such as steel. Device ejector 19 is patterned to fit over contact guides 17. Device ejector 19 also has a patterned opening to allow packaged semiconductor devices to enter test pocket 18. Device ejector 19 has a surface 22, shown in FIG. 4, which contacts packaged semiconductor device 12. Springs 21, shown in FIG. 3, are compressed to allow device 12 to enter test pocket 18. Springs 21 expand to push device ejector 19 away from test pocket 18 so that devices 12 are ejected from test pocket 18.

Figure 4:
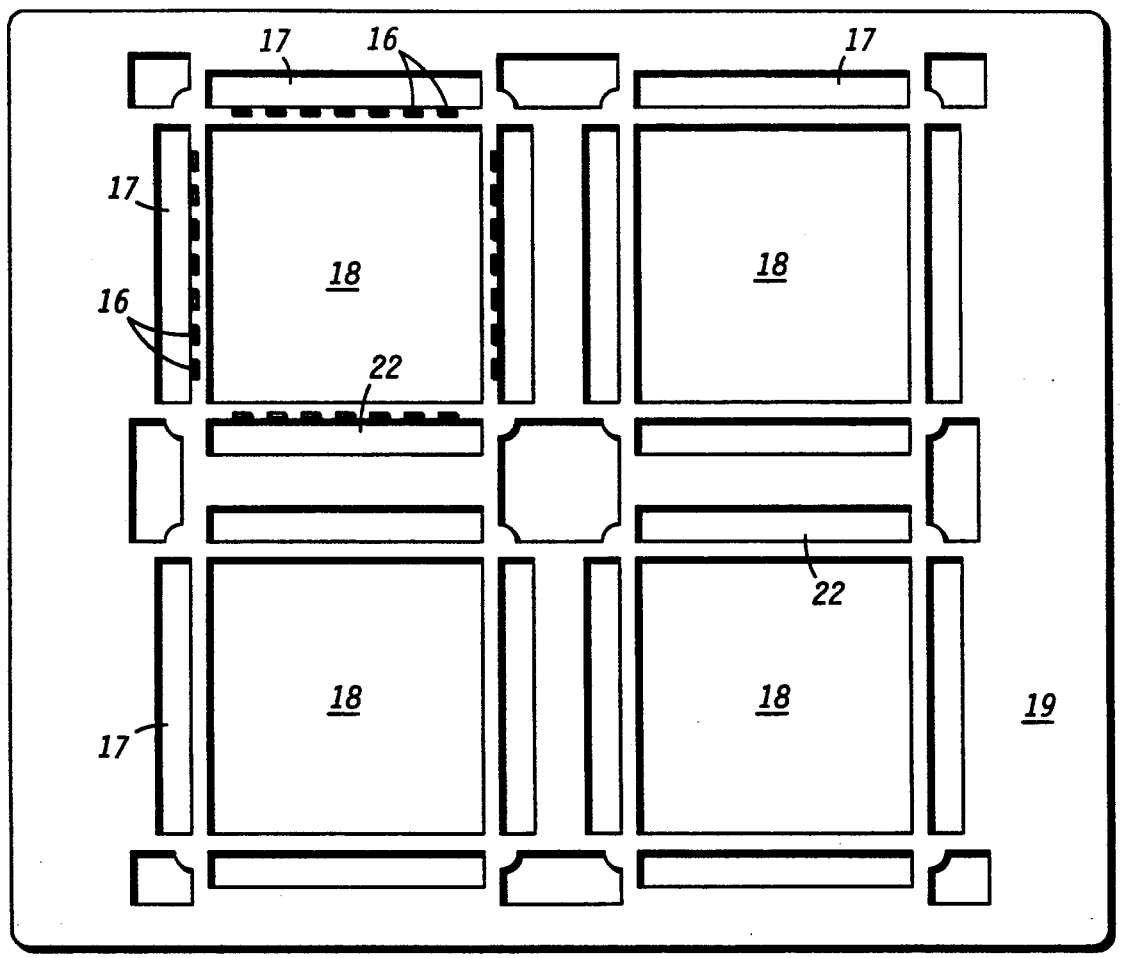
FIG. 4 illustrates a bottom view of the test head shown in FIG. 3.

FIG. 4 illustrates a bottom view of test head 14. For the most part, device ejector 19 is visible. Contact guides 17 extend through device ejector 19, and contacts 16 are visible just outside contact guides 17. Contacts 16 are illustrated in only one test pocket 18 so that surface 22 which contacts the packaged semiconductor device is distinguishable. Also, although only twenty contacts 16 per test pocket 18 are shown for ease of illustration, more commonly tens or hundreds of contacts 16 are used. Contact guides 17 serve also to guide packaged semiconductor devices into test pocket 18 for rapid, accurate insertion. Because device ejector 19 applies pressure to force devices 12 out of test pockets 18, no pick and place tool is needed to extract devices 12 after test, as is often done in prior handlers.

Figure 5:
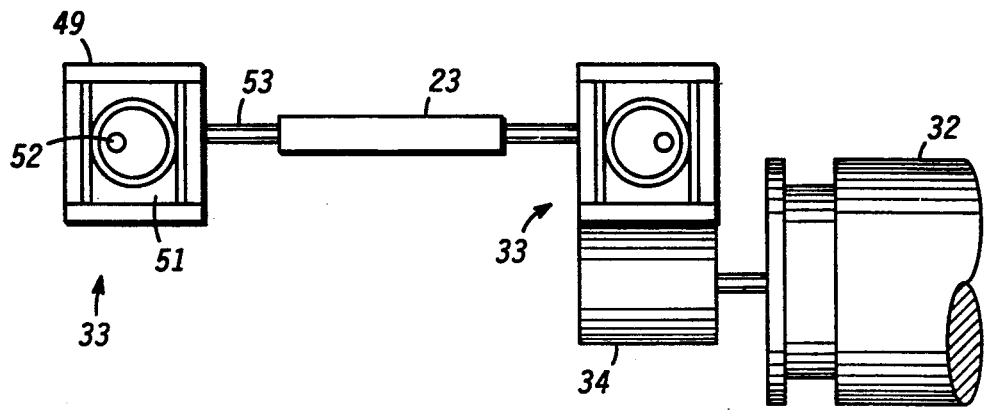
FIG. 5 illustrates a side view of a small portion of the handler shown in FIG. 2.

FIG. 5 illustrates a side view of a portion of handler 11 taken orthogonally to the view shown in FIG. 2. Boat 23 is held firmly by grasps 33 in at least two dimensions to allow rapid acceleration and deceleration of boat 23. In the preferred embodiment, grasps 33 comprise slide housing 49 having several holes for mounting on slide shafts 43 shown in FIG. 2. Eccentric wheel 52 is positioned in a central portion of slide housing 49, and has an off-center hole for coupling to keyed shaft 44 shown in FIG. 2.

Eccentric wheel 52 is coupled to pin 53 which move toward and away from boat 23 depending on the position of eccentric wheel 52. Grasps 33 are activated by turning keyed shaft 44 to extend pins 53. Grasps 33 are deactivated by turning keyed shaft 44 again to retract pins 53. Pins 53 move into slots 57 (illustrated in FIG. 3) in boat 23 to hold the boat rigidly in two dimensions and semi-rigidly in the vertical dimension. Because slots 57 are partially open, boat 23 can lifted off of pins 53 to uncouple boat 23 from grasp 33 before pins 53 are retracted. Thus, boat lift 39, shown in FIG. 2, inserts devices 12 into test head 14 rapidly, without pause for retraction of pins 53. Also, grasps 33 can begin to return to input staging section 31 before retraction of pins 53 is complete, further improving efficiency of motion.

As shown in FIG. 2, keyed shaft 44 is coupled to motor 45 so that all of grasps 33 and 37 can be activated and deactivated at the same time. As shown in FIG. 5, slide housings 49 are attached to belt 34 which is powered by motor 32 to move grasps 33. In this manner rapid, coordinated movement of grasps 33 and boat 23 is possible. Other grasp mechanisms are available which are suitable for grasps 33, such as simple clamps powered by solenoids, or the like. Whatever mechanism is used for grasps 33 and 37, however, should make a positive hold on boats 23 and preferably allow boat 23 to be uncoupled from the grasping mechanism by an independent means, such as boat lift 39.

By now it should be appreciated that a novel handler for packaged semiconductor devices is provided. The handler transports and positions a boat having a number of packaged semiconductor devices therein. By lifting the entire boat to the test head and inserting all of the devices into the test head at one time, handling time is reduced. Because the boat is lifted from the transport mechanism during test, the transport mechanism can continue to operate during the testing, greatly improving efficiency and utilization of both the tester and the handler.

We claim:

1. A handler for testing a number of packaged semiconductor devices having a plurality of leads extending from each package, the handler comprising:

a test head having a plurality of contact strips extending therefrom, wherein each contact strip is for coupling to one of the plurality of leads, and the test head has a number of test pockets for holding the packaged semiconductor devices during testing;

a means for ejecting the packaged semiconductor devices from the test pockets, wherein the means for ejecting is spring mounted to the test head and has a surface which contacts the packaged semiconductor devices and serves to push semiconductor devices out of the test pockets;

a boat having the same number of compartments as the number of packaged semiconductor devices;

a means for transporting the boat under the test head; and a means for lifting the boat so that the packaged semiconductor devices are pressed into the test pockets against the means for ejecting and the leads are pressed against the contact strips while the packaged semiconductor devices remain in the compartments of the boat.

2. The handler of claim 1 wherein the means for transporting further comprises: an input staging section; a testing section; a motor; a first means for grasping the boat; a means for coupling the first means for grasping to the motor so that the first means for grasping moves a first direction when the motor turns clockwise and moves a second direction when the motor turns counterclockwise, wherein when the first means for grasping moves in the first direction it carries the boat from the input staging section to the testing section; an output staging section; a second means for grasping the boat; and a means for coupling the second means for grasping to the motor, wherein when the second means for grasping moves in the first direction it carries the boat from the testing section to the output staging section.

3. The handler of claim 2 wherein the boat is released from the first means for grasping when the means for lifting the boat is activated.

4. The handler of claim 2 wherein the first means for grasping returns to the input staging section while the boat remains in the testing section, and the second means for grasping returns to the testing section while the boat remains in the testing section.

5. A handler for testing a number of packaged semiconductor devices having a plurality of leads extending from each package, the handler comprising:

a test head having a plurality of contacts extending therefrom, wherein each contact is for coupling to one of the leads and said test head having a number of test pockets for holding the packaged semiconductor devices during testing;

a boat for carrying devices, wherein the boat has the same number of compartments as the number of packaged semiconductor devices;

a boat travel path having an input staging section, a testing section which is underneath the test head (14), and an output staging section;

a means for transporting the boat in the travel path rom the input staging section, to the testing section and from the testing section to the output staging section; and a means for moving the boat vertically from the travel path to the test head.

6. The handler of claim 5 wherein the means for transporting the boat further comprises a means for grasping the boat which fully constrains the boat in two dimensions and partially constrains the boat in a third dimension.

7. The handler of claim 5 wherein the means for transporting the boat further comprises a motor, a means for grasping the boat which is coupled to the motor such that when the motor moves in a first direction the means for grasping moves from the input staging section to the testing section.

8. A method for testing a number of packaged semiconductor devices having a plurality of leads extending from each package, the method comprising:
   providing a test head having a plurality of contacts extending therefrom and said test head having a number of test pockets for holding the packaged semiconductor devices during testing;
   providing a boat having the same number of compartments as the number of packaged semiconductor devices;
   placing the number of packaged semiconductor devices in the number of compartments;
   aligning the boat to the test head;
   moving the boat towards the test head to couple the contacts to the plurality of leads;
   testing the plurality of packaged semiconductor devices;
   moving the boat away from the test head while forcing the packaged semiconductor devices to remain in the compartments.

9. The method of claim 8 further comprising: providing a boat travel path having an input staging section, a testing section which is adjacent to the test head, and an output staging section; grasping the boat in the input staging section; and moving the boat to the testing section, wherein the step of moving the boat towards the test head is performed by moving the boat off of the travel path and the step of moving the boat away from the test head comprises replacing the boat in the travel path.

10. The method of claim 8 further comprising: providing a boat travel path having an input staging section, a testing section which is adjacent to the test head, and an output staging section; providing a means for grasping the boat, wherein the means for grasping moves along the boat travel path; positioning the boat and the means for grasping in the input staging section; activating the means for grasping; moving the means for grasping from the input staging section to the testing section; deactivating the means for grasping after the step of moving the boat towards the test head; and moving the means for grasping from the testing section to the input staging section.

11. The method of claim 10 wherein the step of deactivating the means for grasping and the step of moving the means for grasping from the testing section to the input staging section are performed simultaneously.

12. The method of claim 10 wherein the boat is uncoupled from the means for grasping before the means for grasping is deactivated.

13. The method of claim 8 further comprising: providing the boat travel path having an input staging section, a testing section which is adjacent to the test head, and an output staging section; providing a means for grasping the boat, wherein the means for grasping moves along the boat travel path; positioning the means for grasping in the output staging section; moving the means for grasping from the output staging section to the testing section during the step of testing the plurality of packaged semiconductor devices; positioning the boat in the testing section of the travel path after the step of moving the boat away from the test head; activating the means for grasping; and moving the means for grasping from the testing section to the output staging section.

14. A method for testing a number of semiconductor devices having a plurality of leads extending therefrom, the method comprising:
   providing a test head having a plurality of contacts extending therefrom and said test head having a number of test pockets for holding the packaged semiconductor devices during testing;
   providing a first boat having the same number of compartments as the number of semiconductor devices;
   providing a boat travel path having an input staging section, a testing section which is adjacent to the test head, and an output staging section;
   placing the number of semiconductor devices in the first boat;
   positioning the first boat in the input staging section;
   providing a first transport means moving between the input staging section and the testing section;
   attaching the first boat to the first transport means;
   indexing the first boat from the input staging section to the testing section;
   coupling the plurality of contacts to the plurality of leads;
   testing the semiconductor devices in the first boat
   positioning a second boat in the input staging section;
   returning the first transport means to the input staging section;
   attaching the second boat to the first transport means;
   providing a second transport means moving between the testing section and the output staging section;
   attaching the first boat to the second transport means; and
   simultaneously indexing the first boat to the output staging section and the second boat to the testing section.

15. The method of claim 14 wherein the step of returning the first transport means to the input staging section occurs during the step of testing the semiconductor devices in the first boat.

16. The method of claim 14 further comprising the step of moving the second transport means to the testing section during the step of testing the semiconductor devices in the first boat.

17. The method of claim 14 wherein the step of coupling the plurality of contacts to the plurality of leads further comprises removing the first boat from the travel path and inserting the plurality of leads into the test head while the semiconductor devices remain in the boat.

* * * * *